(12) United States Patent  
Fan

(10) Patent No.: US 7,202,715 B1  
(45) Date of Patent: Apr. 10, 2007

(54) MATCHED CURRENT DELAY CELL AND DELAY LOCKED LOOP

(75) Inventor: Yongping Fan, Portland, OR (US)

(73) Assignee: Intel Corporation, Santa Clara, CA (US)

(*) Notice: Subject to any disclaimer, the term of this patent is extended or adjusted under 35 U.S.C. 154(b) by 10 days.

(21) Appl. No.: 11/232,840

(22) Filed: Sep. 21, 2005

(51) Int. Cl.  
*H03L 7/06* (2006.01)

(52) U.S. Cl. ...................................... 327/149

(58) Field of Classification Search ................ 327/149, 327/153, 158, 161–163, 266, 269–271, 274, 327/276–277; 331/1 A, 17, 25; 375/373–376  
See application file for complete search history.

(56) References Cited

U.S. PATENT DOCUMENTS 6,249,164 B1 * 6/2001 Cranford et al. ............ 327/270  
6,621,314 B2 * 9/2003 Krishnamurty ............. 327/158

* cited by examiner

*Primary Examiner*—Linh My Nguyen  
(74) *Attorney, Agent, or Firm*—Blakely, Sokoloff, Taylor & Zafman LLP

(57) ABSTRACT

Matched current delay cells and a delay locked loop based on such cells that may be used for timing data interfaces between semiconductor devices is described. In one embodiment, the delay cell includes a delay cell having a PMOS portion and a NMOS portion, gates of the PMOS portion being coupled to a vp-bias and gates of the NMOS portion being coupled to a vn-bias, the delay cell further being coupled to a reference clock to drive a pulse output of the delay cell, a first bias generation circuit to generate the vn-bias based on a phase comparison of the pulse output to the reference clock, and a second bias generation circuit to generate the vp-bias based on a reference voltage and the vn-bias.

20 Claims, 5 Drawing Sheets

MATCHED CURRENT DELAY CELL AND DELAY LOCKED LOOP

BACKGROUND

1. Field

The present invention relates to timing circuits for interfaces between different semiconductor chips or components, and in particular to a delay locked loop for generating timing signals based on a received reference clock.

2. Related Art

To allow semiconductor devices to communicate at high speeds I/O (in put/output) links at each chip are used to drive data and clock pulses between the two components. In high performance semiconductor systems, the links may be a major factor in the operational speed of the system. The speed of such links may be very important of I/O links between a CPU (central processing unit) and an MCH (memory control hub), between a MCH and memory, between CPUs, between a CPU and memory, and for other chip-to-chip communications.

As microprocessor designs move toward higher speed I/O, low power and low jitter DLLs (delay locked loop) become more important. This may be particularly so when a DLL is used to generate a sampling clock at the center of the data eye. As data rates reach 6.4 GHz, the data eye width for receivers is about 70 ps. This reduces the margin for jitter and reducing the jitter increases the setup and hold time margin. Since chip performance may also be limited by power consumption and the heat produced, lower power circuits also allow for higher processing and I/O performance. As the number of DLLs increases, so does the impact of the power consumption of each DLL. A DDR2 (Double Data Rate 2) interface, for example, uses 108 master and slave DLLs to support the required bandwidth.

Currently two types of delay cell designs are used in high speed I/O links between semiconductor devices. One is the self-biased differential delay cells that are the building blocks of SBDLL (self-biased differential delay-locked loop), and a second is the current starved delay cell. A differential delay cell is basically a differential transistor pair with an NMOS (n-gate metal oxide semiconductor) current source and PMOS (p-gate metal oxide semiconductor) loads, where DC (direct current) current flows. When the low-swing differential waves in the delay chains are converted back to CMOS (Complementary Metal Oxide Semiconductor) signals for clock distributions, another 2-stage differential amplifier is required for each clock output tap. The differential amplifiers consume a significant amount of power and generate a corresponding significant amount of heat.

The jitter performance for SBDLL circuits is also limited by the low output impedance of the short channel transistors used. These transistors are poor current sources. Self-biased differential delay cells also produce duty cycle errors because of differential pair offset and output level shifter distortion.

In current starved delay cells, a p-bias (gate bias to a PMOS device) is generated by a current mirror (a PMOS device that is connected as a MOS diode). However if the pull-up strength and pull-down strength of the p-bias within the current mirror is not matched, the duty cycle of the output will be poorly formed and noise rejection in the power supply will also be poor.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

The present disclosure describes a new low power and low jitter matched current delay cell and its application to a MCDLL (matched current delay look loop). In one application, the described MCDLL consumes only 4.4 mA at 1.0 V and 3.2 GHz. This is less than 20% of the power consumed by a comparable SBDLL in the same application. The MCDLL also two to five times better supply noise induced jitter performance. The MCDLL centers the I/O link sampling clock edge within the data eye in order to improve performance and reduce power consumption.

In one embodiment, the matched current bias generation circuits are used. The vn-bias (gate bias for NMOS) is generated from a phase detector and a charge pump. The vp-bias (gate bias for PMOS) is generated from a feedback loop where a replica delay cell is used. The feedback loop adjusts the vp-bias to match the pull-up current to the pull-down current across process, supply voltage, and temperature variations. The feedback loop helps to maintain a good duty cycle.

The current control PMOS and NMOS circuits isolate clock outputs from Vcc and Vss noise. Vp-bias is coupled to Vcc to achieve differential noise canceling, which together with adaptive charge pumping and optimized loop performance improves the jitter performance. MCDLL clock waves toggle like CMOS signals. This eliminates static current flow in the delay chain reducing power consumption.

Figure 1:
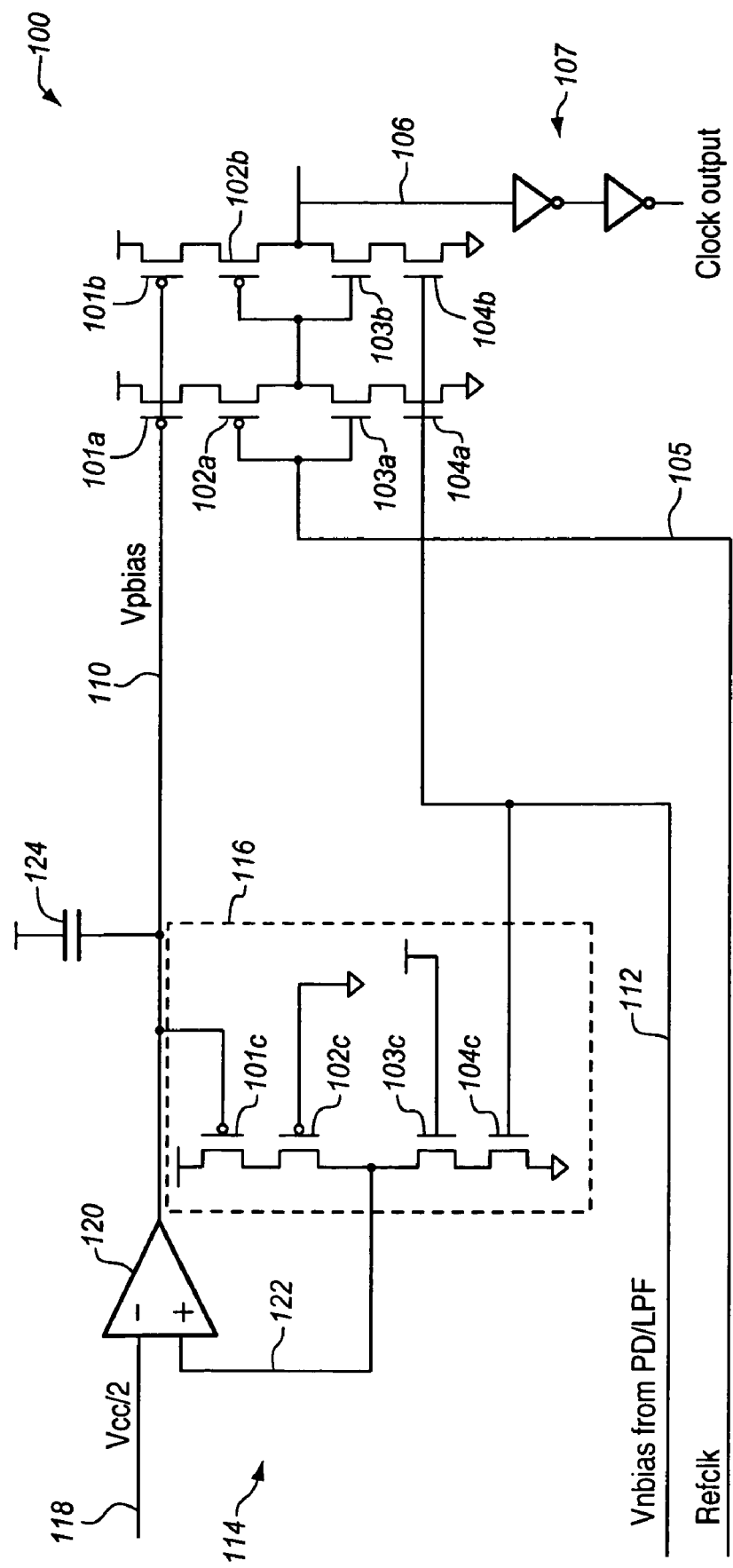
FIG. 1 is a circuit diagram of a matched current delay cell and vp-bias supply circuit according to an embodiment of the invention.

FIG. 1 shows an example schematic diagram of one embodiment of a matched current delay cell (MCDC) 100. The MCDC has a first pair of PMOS devices 101a, 101b with sources coupled to VCC and gates coupled to vp-bias 110. The drains are each coupled to the source of one of a second pair of PMOS devices 102a, 102b. The drains of the second pair of PMOS devices are each coupled to a drain of one of a pair of NMOS devices 103a, 103b. The sources of the NMOS devices are each coupled to the drain of one of a second pair of NMOS devices 104a, 104b. These two NMOS devices have their gates coupled to vn-bias 112 and their sources coupled to ground.

A reference clock 105 is applied to the second PMOS device 102a and the first NMOS device 103a of one of the strings of gates. The junction between the drain and source of these two devices is coupled to the gates of the second PMOS device 102b and the first NMOS device 103b of the other string of devices. The junction between the drain and source of these two devices may be used as the MCDC clock output 106. The output may applied to another stage of a delay locked loop (See FIG. 2). It may also be applied directly as a clock output. In the example of FIG. 1, this output is applied to a pair of inverters 107 to then be used as a clock.

The delay from the delay cell at the clock output 106 is controlled by vn-bias 112 and vp-bias 110. The vn-bias is generated from a phase detector and a charge pump (See FIG. 2). The vp-bias is generated from a feedback loop 114 in which a replica delay cell 116 is used. The replica delay cell includes a first PMOS device 101c with a source coupled to Vcc and its gate coupled to vp-bias, just like the first PMOS devices 101a, 101b of the MCDC. The drain is coupled to the source of a second PMOS device 102c. The drain of the second PMOS device is coupled to a drain of a first NMOS device 103c, the source of which is coupled to the drain of a second NMOS device 104c. The gate of the second NMOS device is coupled to the vn-bias and the source is coupled to ground just like the second pair of NMOS devices 104a, 104b of the MCDC.

In contrast to the MCDC, the gate of the second PMOS device 102c is coupled to ground and the gate of the first NMOS device 103c is coupled to Vcc. The junction between the drain and source of these two devices provides a feedback line 122 to a differential amplifier 120. The four devices of the replica delay cell 116 may be matched closely in physical characteristics to the corresponding pairs of devices in the MCDC. This improves the matching of the vp-bias inputs to the MCDC, as described below.

To generate the vp-bias 110 input to the MCDC, a reference voltage input 118 to a differential amplifier 120 is set at Vcc/2. The feedback line 122 from the replica delay cell 116 provides the other input to the differential amplifier. The output of the differential amplifier is applied to the inputs of the MCDC as the vp-bias. Vp-bias is coupled to the main power supply Vcc through a capacitor 124 for differential noise canceling, which together with optimized loop performance, improves jitter performance.

The feedback loop 114 which includes the differential amplifier 120, the replica delay cell 116, the feedback line 122 and the vn-bias 112 input to the replica delay cell, adjusts the vp-bias to make sure the pull-up current matches the pull-down current in MCDC across process, supply voltage, and temperature variations. Matching pull-up and pull-down current ensures that the charging time is matched to the discharging time.

Figure 2:
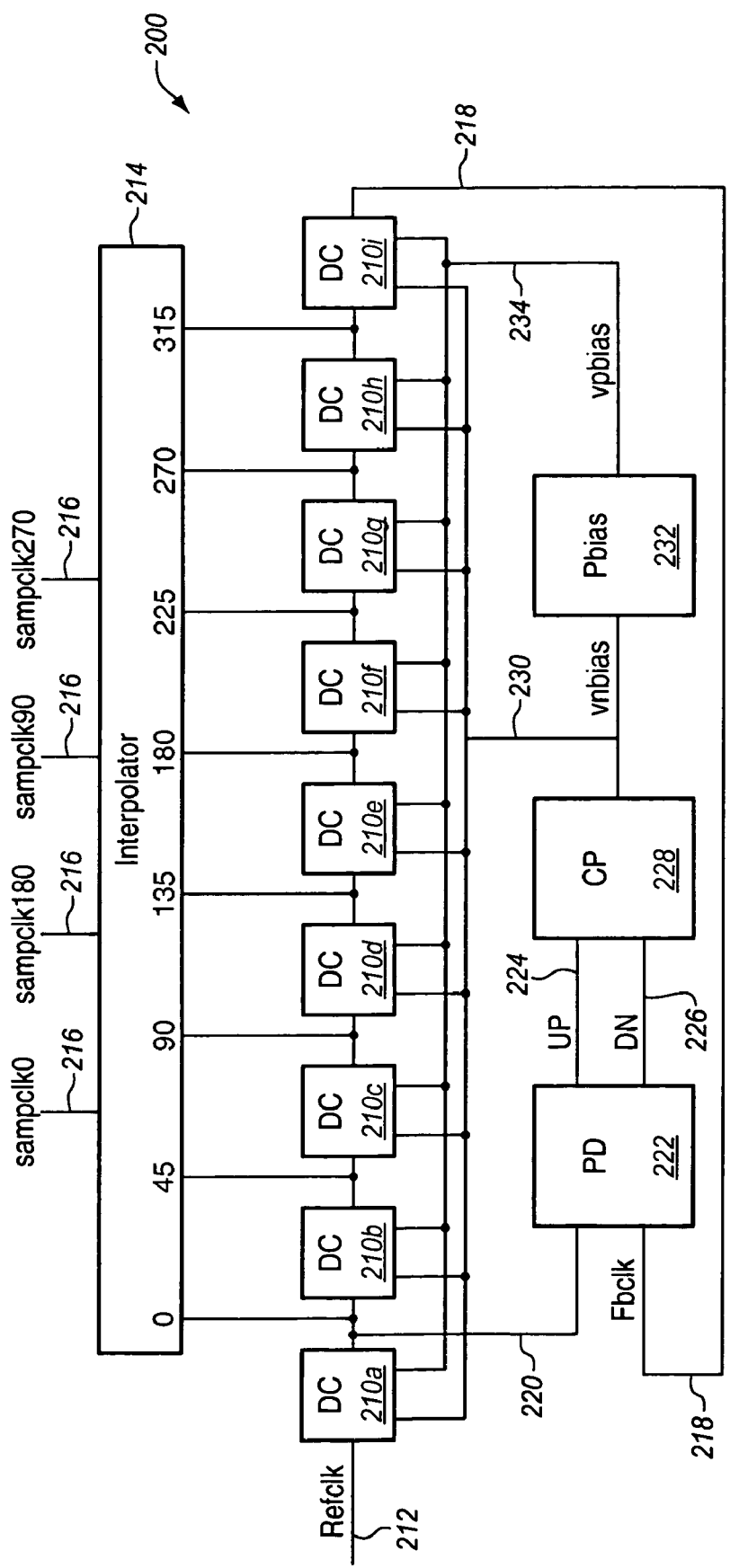
FIG. 2 is a block diagram of a matched current delay locked loop incorporating delay cells according to an embodiment of the invention.

FIG. 2 shows an example of a block diagram of a MCDLL (matched current delay locked loop) 200 that may be built from combinations of MCDCs, such as those of FIG. 1. The MCDLL has a chain of delay cells 210a to 210i starting with a buffer delay cell that is used to buffer the input reference clock. The remaining delay cells in the chain may be similar to the MCDC of FIG. 1. The input to the first delay cell, the buffer delay cell 210a may be a reference clock 212 from clock receiver. Such a reference clock is used for example in the case of high speed CSI (common system interface) link. The output clock of the buffer delay cell is applied to the first matched current delay cell 210b and the output of the first matched current delay cell is applied to the input of the third matched current delay cell 210c and so on down the line to the eighth matched current delay cell 210i as shown in FIG. 2.

The delay cells are coupled to an interpolator 214 that, in the example of FIG. 2 is coupled to the output of each of the delay cells to receive a delay cell output clock with differing amounts of delay. In the present example, each delay cell adds 45 degrees of delay to the reference clock pulse. The output of the buffer delay cell 210a is used as the reference at 0 degrees delay. Using eight MCDCs provides a full circle or 360 degrees of delay. Differing amounts of delay and different numbers of delay cells may be used to suit other applications. The interpolator may combine the delay cell outputs to generate sample clocks 216 for use by downstream circuitry such as I/O circuits.

The rising edge of the output clock 218 from eighth matched current delay cell 210i and the rising edge of the buffered reference clock output 220 of the buffer delay cell 210a are compared at a phase detector (PD). The output clock 218 from the last delay cell 210i is used by the phase detector as a feedback clock to compare with the buffered reference clock 220. The results from the phase detector are presented as an UP output 224 and a DN output 226. These are applied to a charge pump 228. The charge pump produces the vn-bias signal 230 for all of the delay cells 210. This may be applied to the delay cells in the manner shown in FIG. 1.

When the buffered reference clock is ahead of the feedback clock, an UP output 224 of the phase detector 222 will go high and the charge pump 224 will raise the vn-bias 230. This reduces the delay of the feedback clock. When the feedback clock is ahead of the reference clock, the phase detector will set the DN output to high. The charge pump will then lower the vn-bias. This increases the delay. During operation, the circuit will accordingly try to lock the output clock phase to the reference clock phase using the feedback loops. Under locked condition, each delay cell delays the clock by almost exactly 45 degrees. Since the MCDLL locks based in the rising edge of the two clock inputs, it does not require a perfect 50% duty cycle in the input reference clock. In other words, the length of the positive portion of the pulse and the negative portion of the pulse need not be identical, since only rising edges are locked.

Vp-bias 234 may be generated from the vn-bias 230 signal as shown in FIG. 1. This is represented in FIG. 2 as a Pbias circuit 230. The Pbias circuit receives the vn-bias from the charge pump and generates the Vp-bias signal, by for example applying it to a buffer delay cell and a differential amplifier. The vp-bias signal may be applied to the delay cells in the same way as shown in FIG. 1. As shown in FIG. 1, the delay for any one delay cell is controlled by vn-bias and vp-bias. Vn-bias is generated from the phase detector and the charge pump.

Figure 3:
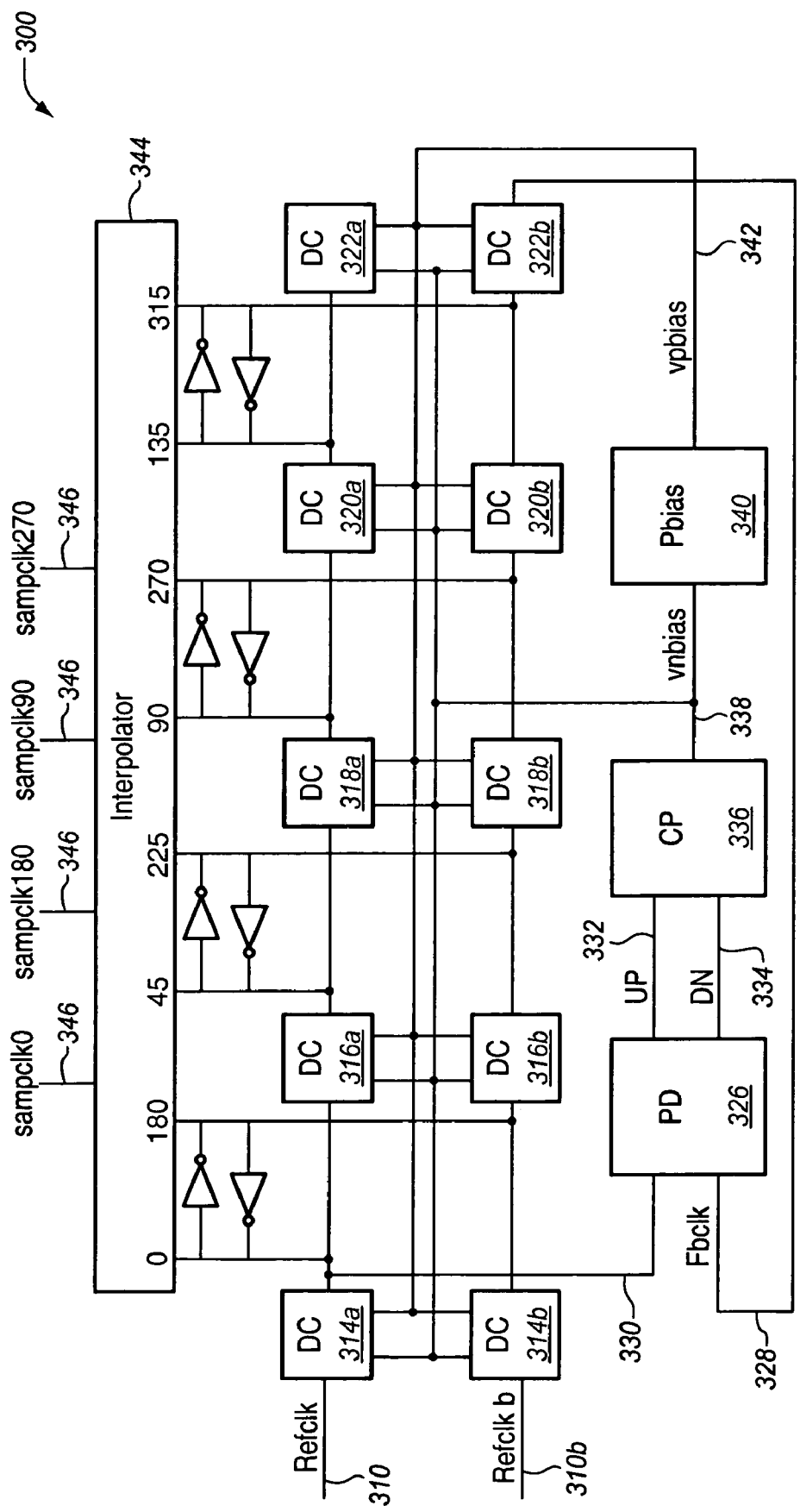
FIG. 3 is a block diagram of phase differential matched current delay locked loop incorporating delay cells according to an embodiment of the invention.

The matched current delay cells of FIG. 1 may also be used to construct a pseudo-differential MCDLL 300, as shown in FIG. 3. In FIG. 3, input differential clocks RefClkA 310, and RefClkB 312 may come from clock receivers. The system has one buffer delay cell 314 and four delay cells 316, 318,320,322 in each clock path. The output of each delay cell is coupled to the input of the next delay cell in the chain until the end of each chain is reached. Compared to the MCDLL 200 of FIG. 2 that has 8 delay stages, the accumulated jitter may be reduced by reducing the number of delay cells.

In the example of FIG. 3, in order to generate vn-bias and vp-bias for each of the delay cells, a phase detector 326 with two inputs is used. One input is a feedback clock 328 from the negative phase of the input reference clocks 310b after 4 stage delays, i.e. the output of the last delay cell 322b of the delay cell chain for RefClkB. This feedback clock is compared to the output 330 of the first delay cell 314a in the chain for the other reference clock RefClkA. The rising edges at the phase detector to generate output signals to a charge pump. As in the example of FIG. 2, when the buffered reference clock 330 is ahead of feedback clock 328, the UP signal 332 will go high and the charge pump 336 will raise vn-bias. This reduces the delay. Otherwise, when the feedback clock 328 is ahead of the buffered reference clock 330, the DN output 334 will go high and vn-bias will lowered. This increases the delay.

The vn-bias may be applied to each delay cell in the same manner as shown in FIG. 1. Similarly, a vp-bias signal 234 may also be applied to each delay cell. The vp-bias signal may be generated as in FIGS. 1 and 2 by applying the vn-bias signal to a Pbias circuit 232 to generate the vp-bias signal.

The bias generation components produce a clock waveform at the delay cell outputs in which the rising time and falling time are well matched. This approaches a perfect 50% duty cycle clock wave at the output tap, which allows for a nearly ideal 50% duty cycle input clock. The high quality duty cycle input may virtually eliminate duty cycle distortion in the MCDLL. Under locked condition, each delay cell delays the clock by 45 degrees, so the total delay in each clock path is 180 degrees. As with an SBDLL circuit, the pseudo-differential MCDLL circuit of FIG. 3 operates best when the differential clocks RefClkA, RefClkB have a perfect or nearly perfect 50% duty cycle.

In the example of FIG. 3, four pseudo-differential clock pairs are obtained by an interpolator 344. The interpolator is coupled to the output of each of the delay cells, however, in contrast to FIG. 2, these outputs are cross coupled. The output of the a chain clock buffer 314a and the output of the b chain clock buffer 314b are cross coupled through a pair of oppositely-facing inverters and then applied to the interpolator. This differential pair may be provided to other downstream circuitry by an interpolator output 346.

Similarly, the output of the first delay cell 316a of the a chain and the first delay cell 316b of the b chain are cross coupled by oppositely facing inverters and applied to the interpolator 344. In the same way, the output of the second delay cell 318a of the a chain and the second delay cell 318b of the b chain are cross coupled by oppositely facing inverters and applied to the interpolator 344. The output of the third delay cell 320a of the a chain and the third delay cell 320b of the b chain are cross coupled by oppositely facing inverters and applied to the interpolator 344. The outputs of the fourth delay cells are not used in FIG. 3 except for feedback. As in FIG. 2, the amount of delay per cell and the number of cells may be varied to suit different application.

The phase interpolator selects two of the eight inputs in a particular pairing, 0 and 45; 45 and 90; 90 and 135; 135 and 180; 180 and 225; 225 and 270; 270 and 315; or 315 and 0; for interpolation. It then interpolates from the selected pair to provide any phase from 0–360 degree interpolation with a uniform phase step. The selected phase is defined by the number of input control bits. During the tuning process, phase interpolator digital control bits are changed to center the sampling clock at the center of the data eye.

Figure 4:
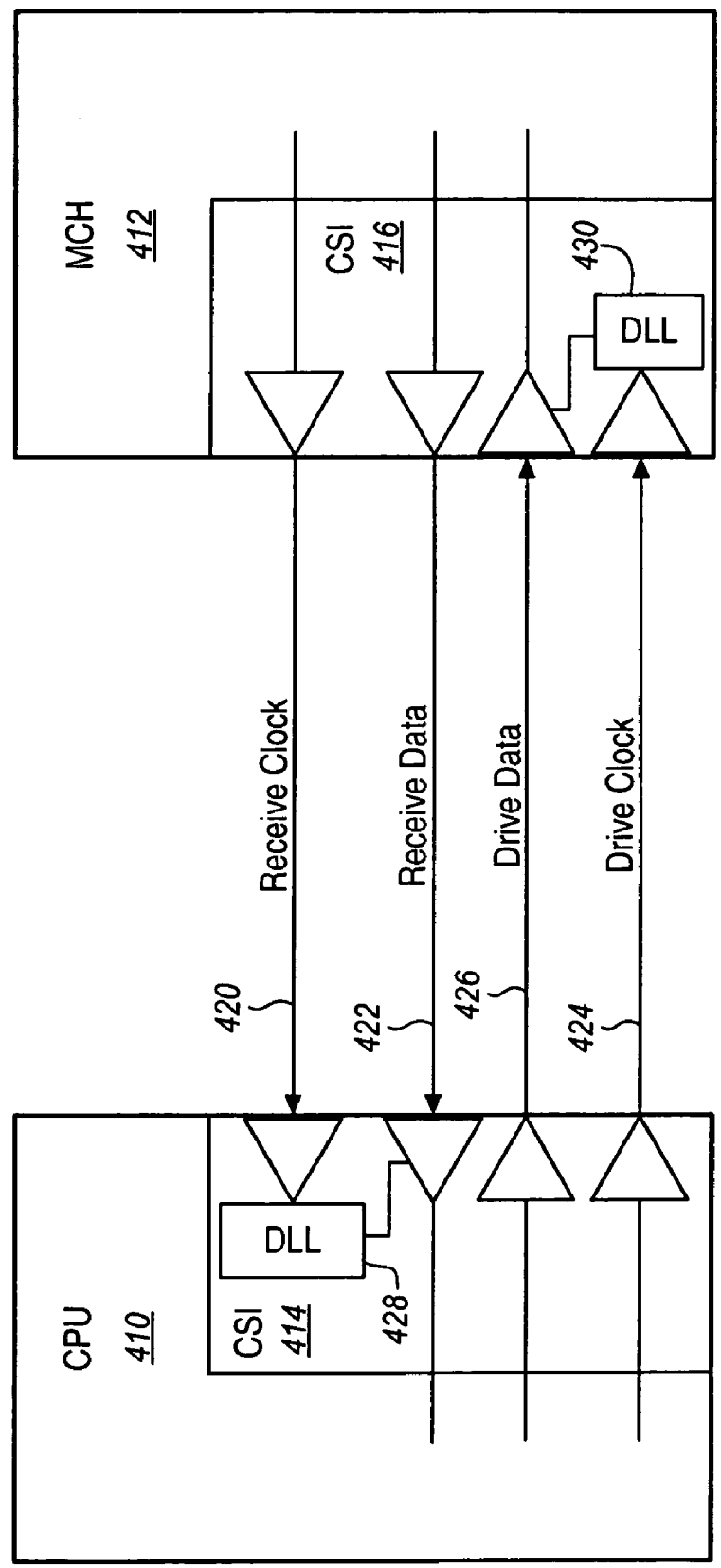
FIG. 4 is a block diagram of a chip-to-chip communication system incorporating a delay locked loop according to an embodiment of the invention.

FIG. 4 shows an example of an application of a DLL (delay locked loop) such as that of FIG. 2 or 3 to a chip-to-chip communication system. In FIG. 4, a first chip 410, in this example a CPU is in communication with a second chip 412, in this example a MCH. A similar connection may occur between other and additional chips and types of chips including other control hubs, memory, processors and other types of devices.

Each chip has an I/O interface, with one or more clock and data lines. For simplicity, only one drive data line and one receive data line are shown in the example of FIG. 4. In some applications, the clock or data lines or both may be differential. From the perspective of the first chip 410, the four lines are a receive clock line 420, a receive data line 422, a drive clock line 424, and a drive data line 426. The clock lines 420, 424 drive a DLL 428, 430 in each interface similar to that shown in FIGS. 2 and 3. The DLL is then coupled to the corresponding receive data line 420, 424 to provide the desired clocking. The two chips can communicate any type of data and signaling through the two interfaces. In one example, the interfaces are a common system interface.

Figure 5:
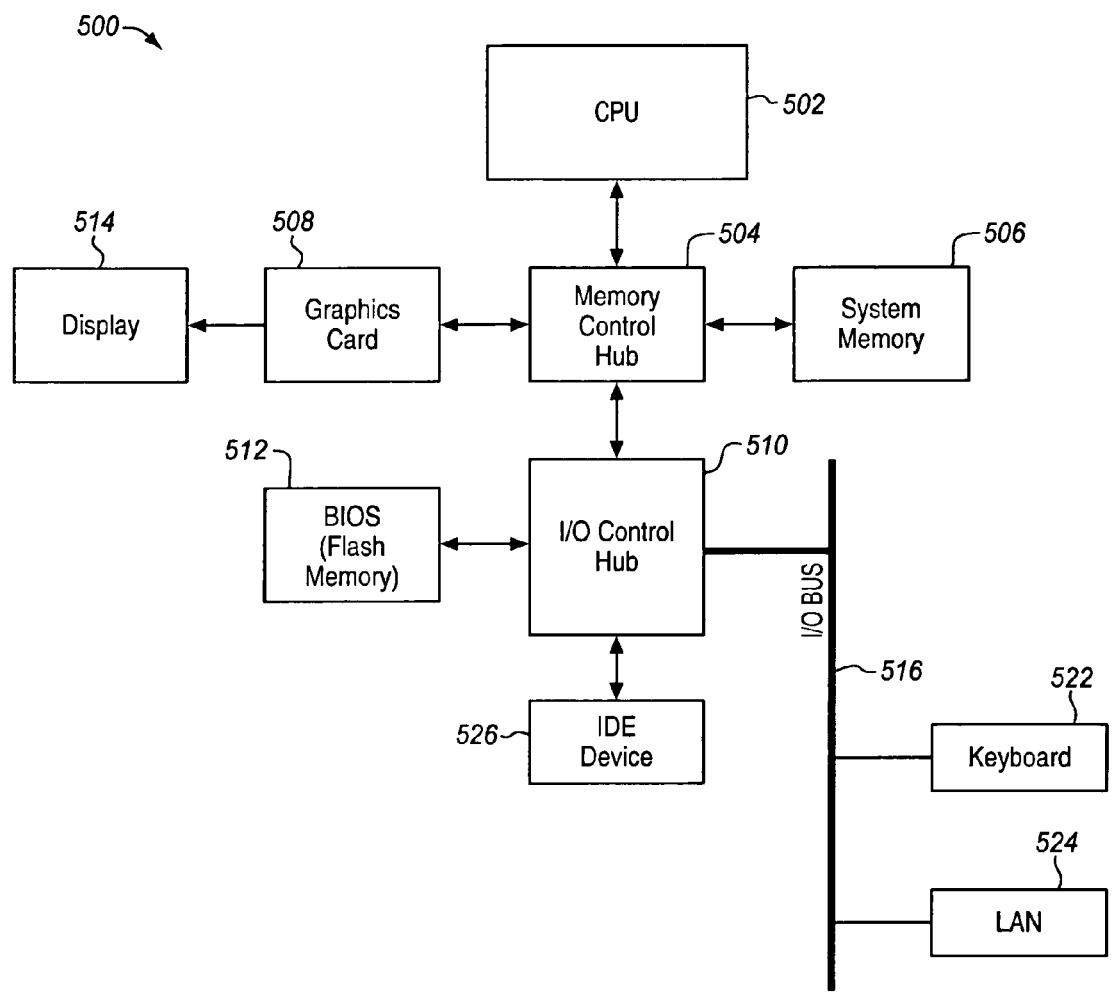
FIG. 5 is a block diagram of computer system incorporating a chip-to-chip communication system according to an embodiment of the invention.

FIG. 5 shows an example of a computer system suitable for using chips such as those of FIG. 4. The computing system 500 includes a CPU 502, which is coupled to a memory control hub 504. The memory control hub 104 is an arrangement of circuitry that manages and controls access to the computer system memory 506, graphics card 508, and the input/output (I/O) control hub 510. The graphics card 508 may provide signals to drive a display 514 through a graphics bus.

The I/O control hub 510 may manage and control access to a flash memory device 512, which stores a BIOS (Basic Input/Output System) and an IDE (integrated device electronics) or ATA (advanced technology attachment) device 526, such as a mass storage device. The IDE device 526 communicates data and commands to and from the host via the controller hub. It may store the system side software such as an OS, applications, and other software. The I/O control hub 510 also manages and controls access to an I/O peripheral bus 516, such as a PCI (peripheral component interconnect) bus, PCI Express bus, SCSI (small computer system interface) bus or other bus to which audio channels, additional IDE ports, keyboards 522, network adapters 524 and other I/O devices may be attached.

The particular nature of any attached devices may be adapted to the intended use of the device. Any one or more of the devices, buses, or interconnects may be eliminated from this system and others may be added. For example, video may be provided on a PCI bus, on an AGP bus, through the PCI Express bus or through an integrated graphics portion of the host controller.

A lesser or more equipped delay cell, replica delay cell, bias generation circuit, interpolator or chip-to-chip interface than the examples described above may be preferred for certain implementations. Therefore, the configuration and ordering of the examples provided above may vary from implementation to implementation depending upon numerous factors, such as the hardware application, price constraints, performance requirements, technological improvements, or other circumstances. Embodiments of the present invention may also be adapted to other types of data flow, interfaces, electronic components, and circuit topologies than the examples described herein.

In the description above, numerous specific details are set forth. However, it is understood that embodiments of the invention may be practiced without these specific details. For example, well-known equivalent components and elements may be substituted in place of those described herein, and similarly, well-known equivalent techniques may be substituted in place of the particular techniques disclosed. In other instances, well-known circuits, structures and techniques have not been shown in detail to avoid obscuring the understanding of this description.

While some embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A delay circuit comprising:
   a delay cell having a PMOS portion and a NMOS portion, gates of the PMOS portion being coupled to a vp-bias and gates of the NMOS portion being coupled to a vn-bias, the delay cell further being coupled to a reference clock to drive a pulse output of the delay cell;
   a first bias generation circuit to generate the vn-bias based on a phase comparison of the pulse output to the reference clock; and
   a second bias generation circuit to generate the vp-bias based on a reference voltage and the vn-bias.

2. The delay cell of claim 1, wherein the first bias generation circuit comprises a phase detector to compare the pulse output to the reference clock.

3. The delay cell of claim 2, wherein the phase detector is coupled to a charge pump, wherein the charge pump generates the vn-bias, and wherein the phase detector adjusts the amplitude of the vn-bias generated based on the comparison.

4. The delay cell of claim 3, wherein the charge pump generates charging and discharging currents that match a pull-up current of the PMOS portion to a pull-down current of the NMOS portion.

5. The delay cell of claim 2, wherein the pulse output is delayed one full cycle compared to the reference clock, and wherein the phase detector compares the rising edge of the pulse output to the rising edge of the reference clock.

6. The delay cell of claim 5, wherein the pulse output is delayed through eight matched current delay cells.

7. The delay cell of claim 1, wherein the second bias generation circuit comprises a replica delay cell to receive the vn-bias and generate a replica voltage output signal.

8. The delay cell of claim 7, wherein the second bias generation circuit comprises a differential amplifier, wherein the replica voltage output signal is applied to the differential amplifier, wherein a reference voltage is also applied to the differential amplifier, and wherein the differential amplifier generates the vp-bias.

9. The delay cell of claim 8, wherein the differential amplifier and replica delay cell match a pull-up current of the PMOS portion to a pull-down current of the NMOS portion using the replica voltage output signal and the reference voltage.

10. The delay cell of claim 1, wherein the reference voltage is half of Vcc and wherein the vp-bias is coupled to Vcc through a capacitance to cancel noise.

11. A delay locked loop comprising:
    a plurality of delay cells, each delay cell receiving a pull-up current control bias and a pull-down current control bias, a first delay cell being coupled to a reference clock to drive a pulse output of the first delay cell, an input of each successive delay cell of the plurality of delay cells being coupled to a respective pulse output of a preceding delay cell of the plurality;
    a first bias generation circuit to generate the pull-down current control bias based on a phase comparison of the pulse output of the last delay cell of the plurality to the reference clock;
    a second bias generation circuit to generate the pull-up current control bias based on a reference voltage and the pull-down current control bias.

12. The delay locked loop of claim 11, wherein the pull-up current control bias comprises a vp-bias received in a PMOS portion of each delay cell and wherein the pull-down current control bias comprises a vn-bias received in a NMOS portion of each delay cell.

13. The delay locked loop of claim 11, wherein the second bias generation circuit comprises a replica delay cell to receive the first bias and generate a replica voltage output signal.

14. The delay locked loop of claim 11, wherein the first bias generation circuit comprises a phase detector to compare the pulse output to the reference clock.

15. A method comprising:
    applying a reference clock, a first bias and a second bias to a plurality of connected delay cells, the reference clock driving a pulse output of the plurality of delay cells, the first and second bias driving the duty cycle of the pulse output,
    generating the first bias using a phase comparison of the pulse output of the plurality of delay cells to the reference clock; and
    generating the second bias based on a reference voltage and the first bias.

16. The method of claim 15, wherein each delay cell produces a pull-down current based on the first bias and a pull-up current based on the second bias, and wherein generating the first bias comprises generating charging and discharging currents that match the pull-up current to the pull-down current.

17. The method of claim 15, wherein the pulse output is delayed one full cycle compared to the reference clock, and wherein generating the first bias comprises comparing the rising edge of the pulse output to the rising edge of the reference clock.

18. A computer system comprising:
    a first chip having a data interface; and
    a second chip having a data interface, the data interface having a clocking circuit to generate a pulse output based on a reference clock received from the first chip, the clocking circuit including a plurality of delay cells, a vn-bias generation circuit, a vp-bias generation circuit, and an interpolator to generate a data clock from the pulse output, each delay cell receiving the vn-bias and the vp-bias, the vn-bias generation circuit to generate the vn bias based on a phase comparison of the pulse output to the reference clock, and the vp-bias generation circuit to generate the vp-bias based on a reference voltage and the vn-bias.

19. The computer system of claim 18, wherein the vn-bias generation circuit comprises a phase detector to compare the rising edge of the pulse output to the rising edge of the reference clock.

20. The computer system of claim 18, wherein the vp-bias generation circuit compares a reference voltage to a voltage generated from the vn-bias to adjust the relative amplitude of the vp-bias.

* * * * *